(12) United States Patent
Kwan et al.

(10) Patent No.: US 12,392,811 B2
(45) Date of Patent: Aug. 19, 2025

(54) PANEL IMPEDANCE SENSING VIA DRIVER REPLICA CURRENT

(71) Applicant: Avago Technologies International Sales Pte. Limited, Singapore (SG)

(72) Inventors: Tom W. Kwan, Cupertino, CA (US); Yue Hu, San Jose, CA (US); Feng Su, San Jose, CA (US); Guowen Wei, San Jose, CA (US); Fang Lin, San Jose, CA (US); Iuri Mehr, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 214 days.

(21) Appl. No.: 18/122,061

(22) Filed: Mar. 15, 2023

(65) Prior Publication Data

US 2024/0310419 A1     Sep. 19, 2024

(51) Int. Cl.
    *G01R 27/02*     (2006.01)
    *G01R 19/00*     (2006.01)
    *G06F 3/041*     (2006.01)
    *G06F 3/044*     (2006.01)

(52) U.S. Cl.
    CPC ......... *G01R 27/02* (2013.01); *G01R 19/0046* (2013.01); *G06F 3/0416* (2013.01); *G06F 3/044* (2013.01)

(58) Field of Classification Search
    CPC .... G01R 27/02; G01R 27/08; G01R 27/2605; G01R 19/0007; G01R 19/0046; G01R 19/0092; G06F 3/041; G06F 3/0412; G06F 3/0416; G06F 3/04182; G06F 3/044
    See application file for complete search history.

(56) References Cited

U.S. PATENT DOCUMENTS

| | | | | |
|---|---|---|---|---|
| 5,783,951 A | * | 7/1998 | Inoue | G01D 5/24 327/563 |
| 2011/0186359 A1 | * | 8/2011 | Chen | G06F 3/04182 178/18.06 |
| 2013/0193990 A1 | * | 8/2013 | Wu | G01R 27/2605 324/679 |
| 2014/0285462 A1 | * | 9/2014 | Lee | G06F 3/0416 345/173 |
| 2017/0089966 A1 | * | 3/2017 | Birk | G01R 27/2605 |
| 2017/0277316 A1 | * | 9/2017 | Teranishi | H10K 59/40 |
| 2018/0172744 A1 | * | 6/2018 | Chang | H03K 17/962 |
| 2018/0253171 A1 | * | 9/2018 | Saether | G06F 3/0446 |
| 2019/0257870 A1 | * | 8/2019 | Shimada | H03F 3/70 |
| 2022/0011891 A1 | | 1/2022 | Yu | |

OTHER PUBLICATIONS

European Extended Search Report on EP App. No. 241621291.1 dated Aug. 14, 2024.

* cited by examiner

*Primary Examiner* — Steven L Yeninas
(74) *Attorney, Agent, or Firm* — Foley & Lardner LLP

(57) ABSTRACT

A circuit includes a driver to provide a voltage at a node of a load and a first circuit to facilitate determining a load current at the node. The load is a capacitive load and the first circuit facilitates determining the load current by measuring a replica current and determining a capacitance of the load using values of the voltage and the replica current.

19 Claims, 10 Drawing Sheets

PANEL IMPEDANCE SENSING VIA DRIVER REPLICA CURRENT

TECHNICAL FIELD

The present description relates generally to electronic circuits, including, for example, panel impedance sensing via driver replica current.

BACKGROUND

Many electronic displays, including displays of the electronic devices, for example, consumer electronic devices, laptops, hand-held electronic devices such as tablets and phones and smartwatches, use display panels formed of a two-dimensional sensor array. The sensor arrays are implemented as two or more layers formed over a cover glass. The sensor arrays are typically modeled with a two-dimensional distributed resistor-capacitor (RC) circuits that are powered by driver circuits. For example, an N by M pixel-array panel is formed by a two-dimensional array of M*N pixels, and each pixel is represented by an RC circuit. The resistors of each row or column are serially connected to one another, and the capacitors are connected between successive resistors and a ground potential. The N by M pixel-array panel can be powered, for example, by N horizontal drivers and M vertical drivers.

BRIEF DESCRIPTION OF THE DRAWINGS

Certain features of the subject technology are set forth in the appended claims. However, for purposes of explanation, several aspects of the subject technology are depicted in the following figures:

DETAILED DESCRIPTION

Figure 1:
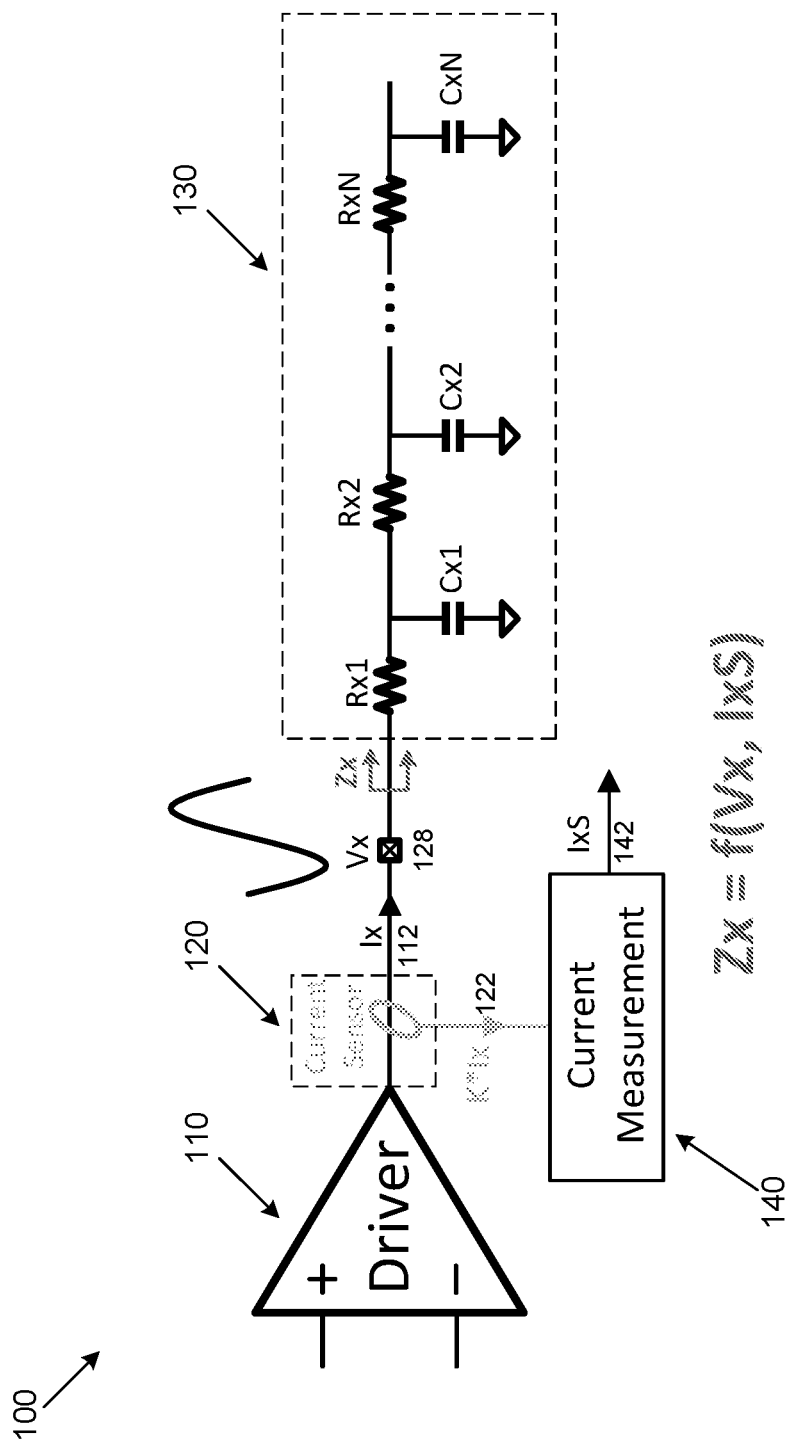
FIG. 1 is a schematic diagram illustrating an example of a circuit for panel impedance sensing, within which some aspects of the subject technology are implemented.

The detailed description set forth below is intended as a description of various configurations of the subject technology and is not intended to represent the only configurations in which the subject technology may be practiced. The appended drawings are incorporated herein, and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

According to some aspects, the subject technology is directed to panel impedance sensing via a driver replica current. The panel may include a touch-display panel formed of an N by M array of resistor-capacitor (RC) circuits. The touch-display panel can be used in an electronic device, for example, a consumer electronic device, a laptop computer, a desktop computer, a smart TV, a hand-held electronic device such as a tablet and a phone, a smartwatch and similar devices. The subject technology allows panel impedance and/or bandwidth testing using minimal hardware. The disclosed technique drives the pixels with a stimulus voltage ($V_{pix}$) and measures a pixel current ($I_{pix}$) using a replica current. In some embodiments, a pixel current is the current drawn by a pixel of a display panel from a corresponding driver circuit. A single measurement can provide an estimate of a total load capacitance. Using two different frequencies, the subject technology computes a single-pole RC approximation. Using additional measurements allows extracting higher order model parameters, as further discussed herein. The technique of subject technology allows taking into account parasitic capacitor load at an output of the driver.

In some embodiments, a circuit of the subject technology includes a driver to provide a voltage at a node of a load and a first circuit to facilitate determining a load current at the node. The load is a capacitive load, and the first circuit facilitates determining the load current by measuring a replica current and determining a capacitance of the load using values of the voltage and the replica current.

In some embodiments, a circuit for impedance sensing includes a driver to provide a voltage at a node of a panel. A first circuit coupled to the node facilitates measuring a replica current and determining an admittance of the panel at the node by using the replica current and the voltage. In some embodiments, the admittance is a capacitive admittance. In some embodiments, a capacitive admittance refers to the admittance of a circuit that is formed by interconnection of two or more capacitors or can be reduced to an equivalent circuit including one or more capacitors.

In some embodiments, a communication device includes a display panel and a driver to provide a voltage at a node of the display panel. A first circuit is coupled to the node to facilitate measuring a replica current and determining a capacitance of the display panel by using peak-to-peak values of the voltage and the replica current, as described in more details herein.

FIG. 1 is a schematic diagram illustrating an example of an apparatus 100 for panel impedance sensing, within which some aspects of the subject technology are implemented. The apparatus 100 includes a driver circuit 110, a current sensor 120, a load 130 and a current-measurement circuit 140. In some embodiments, the driver circuit 110 provides a voltage Vx at a node 128 of the load 130. In some embodiments, the driver circuit 110 may include an amplifier and a buffer circuit. In some embodiments, the current sensor 120 is an operational amplifier current sensor or a Hall-effect current sensor. In some embodiments, the load 130 is a capacitive load that includes a distributed (lumped) resistor-capacitor (RC) circuit, as shown in FIG. 1. For example, the load 130 includes a number of resistors Rx1, Rx2 ... RxN and a number of capacitors Cx1, Cx2 ... CxN, connected between end terminals of the respective resistors and the ground potential, as shown in FIG. 1. In some embodiments, the load 130 represent an impedance of a touch-sensitive layer of a touch-display panel of an electronic device. The current sensor 120 detects a current 122, which is measured by the current-measurement circuit 140. The current 122 is proportional to the current 112 (Ix) with a proportionality factor of K. The measured current 142 (IxS) is used to determine an impedance Zx of the load 130, as seen from the node 128. In the context of the subject disclosure, a node is an interconnection of two or more circuits or circuit element. For example, the node 128 is an interconnection between the driver circuit 110 and the load 130. In the context of the subject disclosure, a load consists of one or more circuit elements that are connected to a circuit (e.g., the driver circuit 110) and receive, for example, energy or power from that circuit or draw a current from the circuit. This current is referred to as a load current. The impedance Zx is a function (f) of the voltage Vx and the measured current 142 (IsX) and can be expressed as: Zx=f (Vx, IsX).

The subject disclosure implements the combination of the current sensor 120 and current-measurement circuit 140, as described herein, to enable panel impedance and/or bandwidth testing of the display panel by using minimal hardware. Further, the subject technology would allow taking into consideration the effects of the parasitic capacitor load at an output of the driver circuit 110.

Figures 2A, 2B:
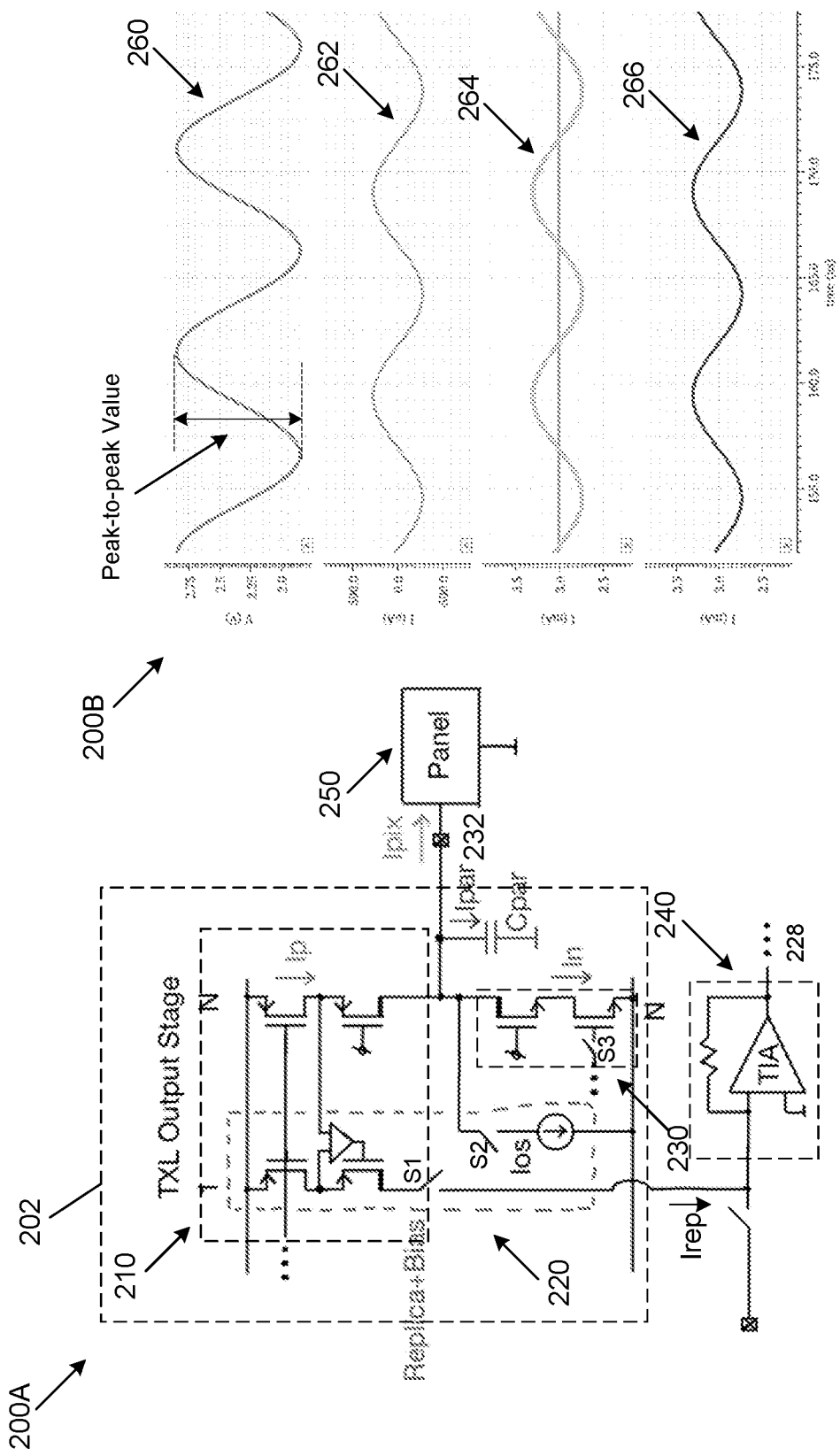
FIGS. 2A and 2B are schematic diagrams illustrating an example of a circuit for panel impedance sensing via a driver replica current and a corresponding chart, according to aspects of the subject technology.

FIGS. 2A and 2B are schematic diagrams illustrating an example of an apparatus 200A for panel impedance sensing via a driver replica current and a corresponding chart 200B, respectively, according to aspects of the subject technology. The apparatus 200A may include an output stage of a transmit (TX) amplifier and uses a driver circuit 202 and a current measurement circuit 240. The driver circuit 202 is coupled to the panel 250 at a node 232 and provides a pixel current Ipix to the panel 250. The capacitor Cpar is a parasitic capacitor, which draws a current Ipar. The driver circuit 202 may further include a current sensor (similar to, for example, the current sensor 120 in FIG. 1). The driver circuit 202 further includes, but is not limited to, a circuit 210, a circuit 220 and an output stage 230. The circuit 210 is formed of p-type metal-oxide-semiconductor (PMOS) transistors and provides a current equal to Ip through the circuit 220, which also includes a direct-current (DC) current source Ios and switches S1 and S2. The circuit 220 may be characterized as a replica circuit that provides a replica current (Irep). In this regard, the circuit 220 is designed in part to replicate and match the current Ip. The replica current (Irep) is scaled by 1/N, but can subsequently be multiple by N to provide a replicated/matching current. The output stage 230 includes a pair of N-type MOS (NMOS) transistors and a switch S3. The output stage 230 provides a path for an alternate-current (AC) component of the current Ip to the ground.

In a configuration operation, when the switches S1 and S2 are closed, the replica current (Irep) from the circuit 220 is provided to the current measurement circuit 240. In some embodiments, the current measurement circuit 240 is a circuit configured to provide a measurable voltage proportional to the current being measured. Current measurement circuit 240 may include a transimpedance amplifier (TIA) that generates a voltage based on a feedback loop into the current measurement circuit 240. Also, the DC current source Ios is provided based on the switch S2 closing. Also, when the switch S3 is opened, the current In of the output stage 230 is set equal to zero. In this configuration, if the parasitic capacitance Cpar and the corresponding current Ipar are ignored, the current Ipix is given as:

$$Ipix = Ip - Ios \qquad (Eq. 1)$$

Considering that Ios is a DC current with zero peak-to-peak (ptp) value, $$Ipix(ptp) = Ip(ptp) \qquad (Eq. 2)$$

Because Ip is equal to (or proportional to) the replica current (Irep), a ptp value (e.g., as shown in the plot 260) associated with the replica current (Irep) is equal (or proportional to, respectively) to a second ptp value associated with the load current (Ipix).

Figure 7:
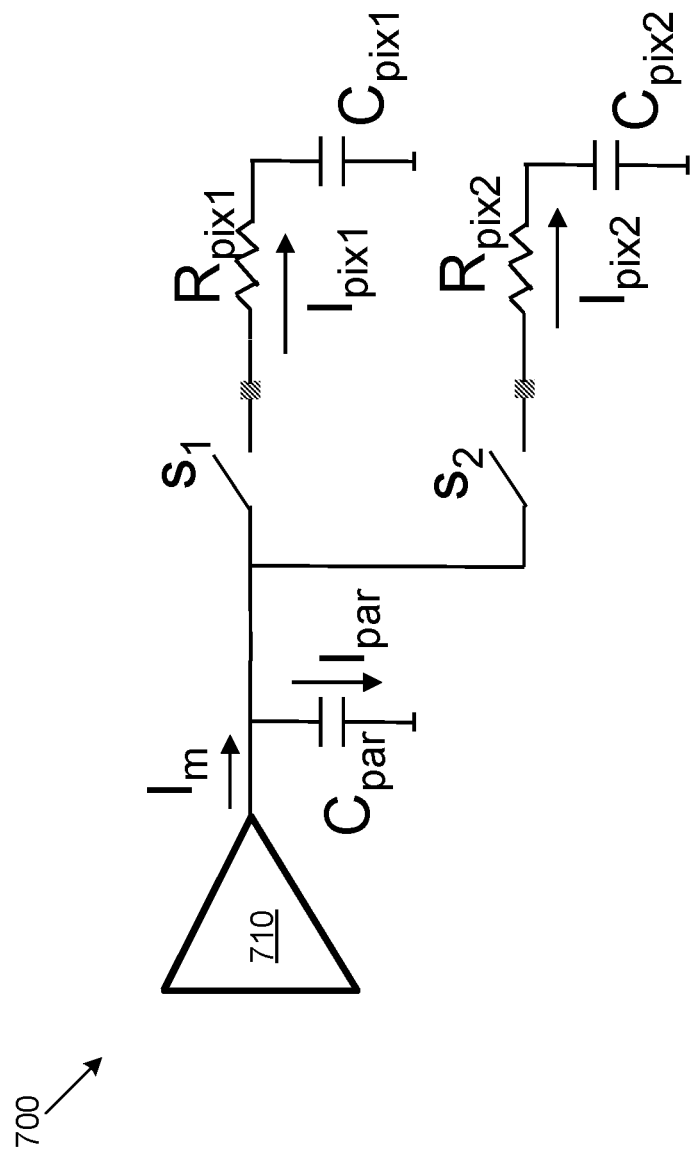
FIG. 7 is a schematic diagram illustrating an example of a circuit for an improved impedance estimate via pixel load reconfiguration, according to aspects of the subject technology.

From this, the admittance Y of the panel 250 can be obtained:

$$Y = Ip(ptp)/Vtxp(ptp) \qquad (Eq. 3)$$

where Vtxp is the voltage at the node 232, and the ptp value of Ip is the same as the ptp value of replica current Irep, which is converted to a sinusoidal voltage with a known frequency at an output node 228 of the current measurement circuit 240. The known frequency is the operating frequency of the TX amplifier. The measured sinusoidal voltage is converted to a digital signal, which, by using a known demodulation and fast-Fourier transform (FFT) operation, is converted to a ptp voltage value that is proportional to the ptp value of the replica current Irep. Then, the ptp value of the Ipix, which is the same as the ptp value of Ip (see Eq. 2) can be derived from the ptp value of the Irep. The DC current source Ios is considered part of the measurement error in the topology of FIG. 2. The value of Cpar can be de-embedded, as shown in FIG. 7, by making two measurements, one measurement with S1 closed and the other one with both S1 and S2 closed.

In some embodiments, the driver circuit 202 provides the voltage Vtxp at the node 232 of the load (e.g., the panel 250). In some embodiments, a first circuit (e.g., circuit 210 and the circuit 220) facilitate determining a load current (e.g., Ipix) at the node 232. The load is a capacitive load and the first circuit facilitates determining the load current by measuring a replica current (e.g., Irep) and determining a capacitance of the load using values of the voltage and the replica current. In some embodiments, the load includes at least a portion of a touch-display panel, and the load current (Ipix) is a pixel current associated with the touch-display panel. In some embodiments, the voltage Vtxp is a periodic voltage (stimulus voltage), for example, with a sinusoidal waveform and a stimulus frequency. In general, a periodic voltage can have a number of waveforms, for example, a sinusoidal waveform, a square waveform, a triangular waveform or other waveforms. In some embodiments, the first circuit (e.g., circuit 210 and the circuit 220) includes a bias-current source (Ios) and circuit 210 provide the replica current (Irep) to a current measurement circuit 240.

In some embodiments, the current measurement circuit 240 is a trans-impedance amplifier (TIA) circuit that provides a measurable voltage proportional to the replica current Irep at an output node 228 of the TIA. In some embodiments, the current measurement circuit 240 facilitates extracting (determining) a single-pole RC model parameter associated with the load via measurements at different frequencies (e.g., two stimulus frequencies), as described herein.

The chart 200B includes plots 260, 262, 264 and 266. The plot 260 shows simulated time variation of the voltage at node 232. Plots 262, 264 and 266 depict simulated time variations of the load current Ipix, current Ip and the replica current Irep, respectively. As seen from the plot 264, the current load current Ipix has no DC value (due to no constant current value) and thus shows a ptp value. The current Ip has the bias current Ios component. In some embodiments, a bias current is a DC current provided by a current source and used for biasing a circuit.

Figures 3A, 3B:
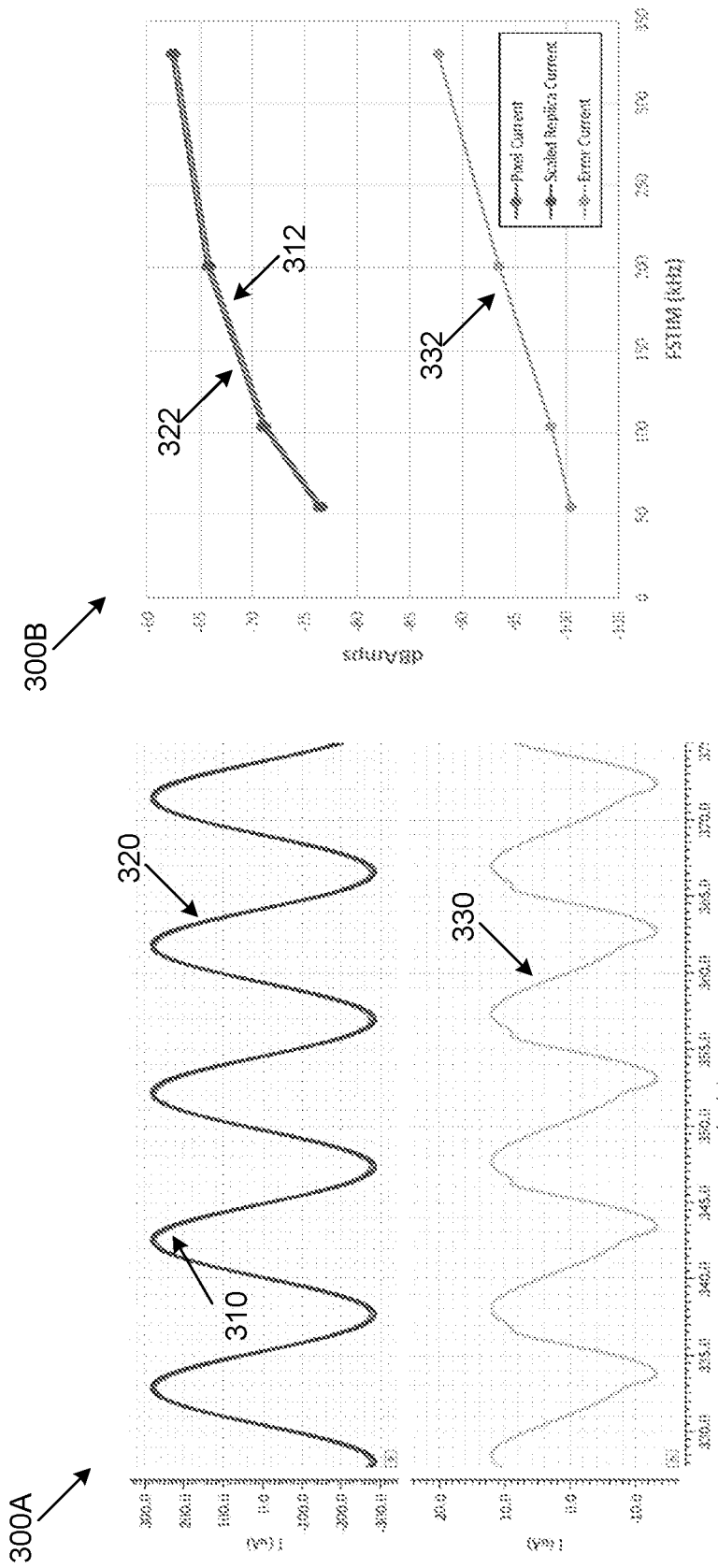
FIGS. 3A and 3B are charts illustrating simulated replica and pixel currents, according to aspects of the subject technology.

FIGS. 3A and 3B are charts 300A and 300B illustrating simulated replica current and pixel currents, according to aspects of the subject technology. The chart 300A includes plots 310, 320 and 330. The plots 310 and 320 show time variations of the replica current Irep and the load current Ipix, respectively, which are generally similar and almost overlap one another. The plot 330 shows time variation of an error current, which is the difference between the plots 310 and 320, in an enlarged different scale and shows about 4% to 6% error between the measured Ireq and the load current Ipix. The error is due to the parasitic capacitance Cpar at the node 232 (shown in FIG. 2). The subject technology is designed calibrate and offset the effect of this capacitor, as discussed below.

The chart 300B includes plots 312, 322 and 332. The plots 312 and 322 show frequency variations of the replica current Irep and the load current Ipix, respectively, which are generally similar and almost overlap one another. The plot 332 shows frequency variation of an error current, which is the difference between the plots 312 and 322, in an enlarged different scale between frequencies of 50 kilohertz (KHz) and 300 KHz. The charts 300A and 300B indicate the measured replica current Irep is a good match for the load current Ipix.

Figure 4:
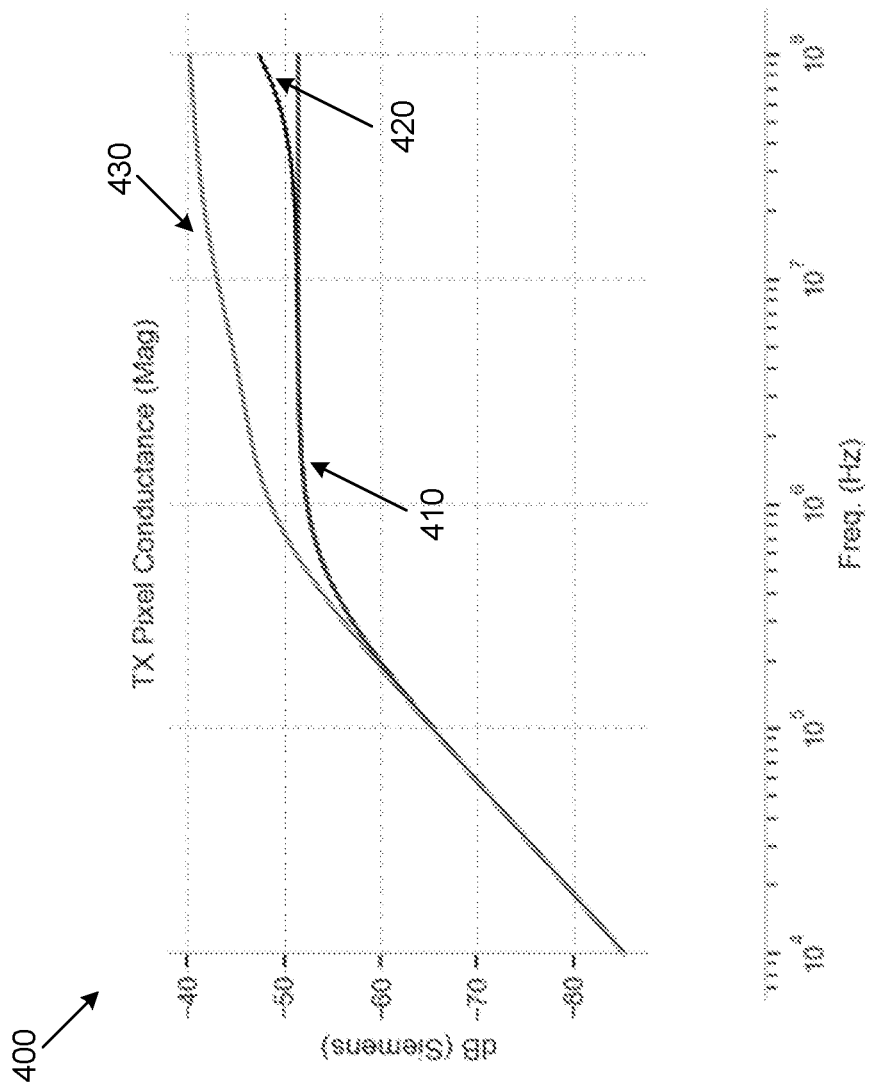
FIG. 4 is a chart illustrating a pixel total capacitance estimate, according to aspects of the subject technology.

FIG. 4 is a chart 400 illustrating a pixel total capacitance estimate, according to aspects of the subject technology. The chart 400 includes plots 410, 420 and 430 showing simulated pixel total impedances using a single pole model (RC), a lumped model two-pole model (RC-RC) and a distributed model, respectively. Below 100 KHz, which is good for capacitance measurement, the three models produce similar results.

Figures 5A, 5B:
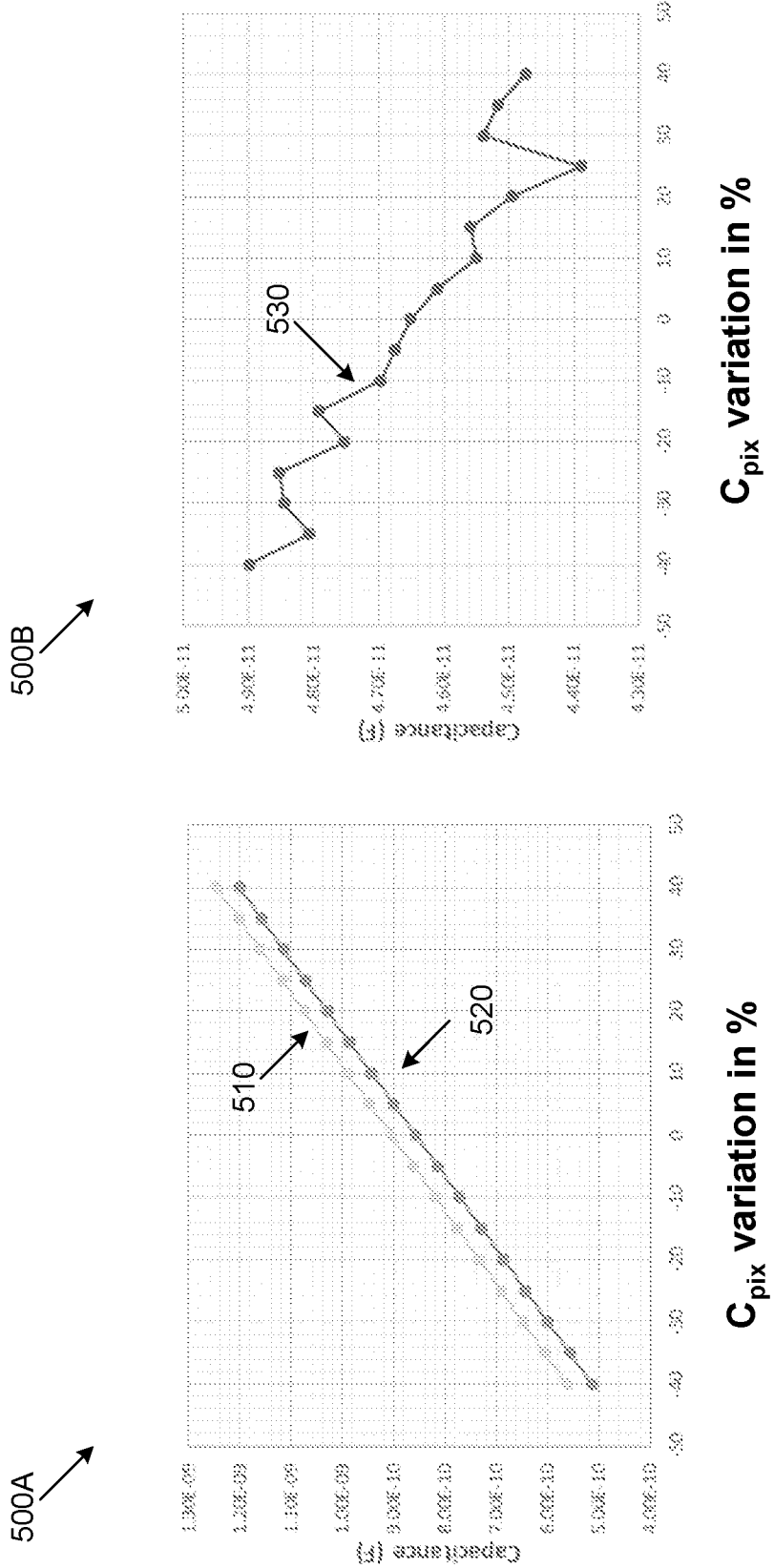
FIGS. 5A and 5B are charts illustrating simulation result with a panel R/C sweep, according to aspects of the subject technology.

FIGS. 5A and 5B are charts 500A and 500B illustrating simulation result with a panel R/C sweep, according to aspects of the subject technology. The chart 500A includes plots 510 and 520 showing the total capacitance and the pixel capacitance, respectively. The total capacitance ($C_{total}$) is obtained by measuring the conductance ($Y_1$) at a low stimulus frequency $\omega_1$ (e.g., $2\pi*30$ KHz) as follows:

$$C_{total} = Y_1/\omega_1 \quad \text{(Eq. 4)}$$

The plot 510 shows the total capacitance value versus variation (in %) of the pixel capacitance. The difference in capacitance values, as shown in the plots 510 and 520, is due to the parasitic capacitance (Cpar), which is depicted in a plot 530 of the chart 500B. The average value for the parasitic capacitance (Cpar) is seen to be about 47 picofarad (pF). The charts 500A and 500B are the result of testing the effectiveness of the single-pole approximation measurement. The chart 500A shows the measured value of Cpix increasing as we sweep Cpix. The chart 500B shows the subtracted value, Cpar=Ctotal–Cpix, given the Cpix variation.

In some aspects, the single-pole RC model parameters can be extracted (determined) from two measurements at two different stimulus frequencies $\omega_1$ (e.g., $2\pi*100$ KHz) and $\omega_2$ (e.g., $2\pi*300$ KHz) as follows:

$$\alpha = (Y_1^2\omega_2^2)/(Y_2^2\omega_1^2) \quad \text{(Eq. 5)}$$

$$Y = RC = ((1-\alpha)/(\alpha\omega_1^2 - \omega_2^2))^{1/2} \quad \text{(Eq. 6)}$$

$$C = (Y_1/\omega_1)(1 + \omega_1^2 * T^2)^{1/2} \quad \text{(Eq. 7)}$$

$$R = T/C \quad \text{(Eq. 8)}$$

where the measurements correspond to two points on the plot 410 of FIG. 4.

Figures 6A, 6B:
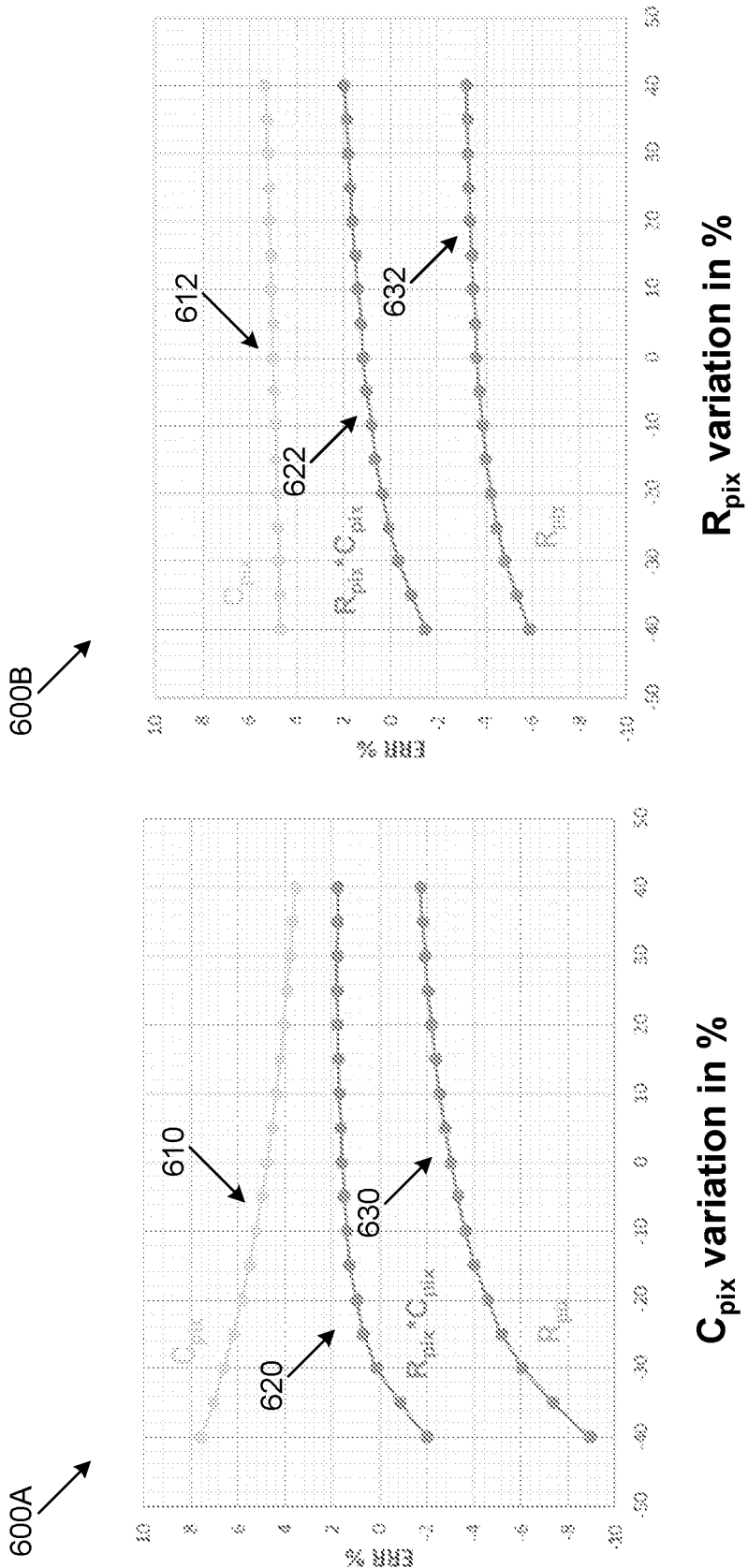
FIGS. 6A and 6B are charts illustrating total load capacitance extraction using a single measurement, according to aspects of the subject technology.

FIGS. 6A and 6B are charts 600A and 600B illustrating total load capacitance extraction using a single measurement, according to aspects of the subject technology. The chart 600A includes plots 610, 620 and 630, showing errors (%) in values of Cpix, Cpix*Rpix and Rpix, respectively, versus Cpix variation (%). The chart 600B includes plots 612, 622 and 632, showing errors (%) in values of Cpix, Cpix*Rpix and Rpix, respectively, versus Rpix variation (%). The charts 600A and 600B are simulation results of a one-time measurement and indicate that, given manufacturer variation on R or C of [40% to 40%], the measured RC accuracy by the implemented circuit is within two percent.

FIG. 7 is a schematic diagram illustrating an example of a circuit 700 for an improved impedance estimate via pixel load reconfiguration, according to aspects of the subject technology. In some embodiments, the circuit 700 is a load-reconfiguration circuit that is used to remove an effect of a parasitic capacitance Cpar (e.g., Cpar of FIG. 2A) at an output node of the first circuit from a measured replica current (e.g., Irep of FIG. 2A). The circuit 700 includes an amplifier 710, switches $S_1$ and $S_2$, pixel resistors $R_{pix2}$ and $R_{pix2}$ and pixel capacitances $C_{pix1}$ and $C_{pix2}$. The parasitic capacitance Cpar is not part of the single-model RC parameter discussed above. The circuit 700 is used to measure pixel currents ($I_{pix1}$ or $I_{pix2}$) by eliminating the effect of the parasitic capacitance Cpar in three steps. First, switch $S_1$ is closed while switch $S_2$ is open and a first measured current ($I_{m1}$) is obtained which is:

$$I_{m1} = I_{par} + I_{pix1} \quad \text{(Eq. 9)}$$

Second, switches $S_1$ and $S_2$ are closed and a second measured current ($I_{m2}$) is obtained which is:

$$I_{m2} = I_{par} + I_{pix1} + I_{pix2} \quad \text{(Eq. 10)}$$

Third, $I_{m1}$ is subtracted from $I_{m2}$ to obtain $I_{pix2}$:

$$I_{pix2} = I_{m2} - I_{m1} \quad \text{(Eq. 11)}$$

The pixel current $I_{pix1}$ can be obtained similarly.

Figure 8:
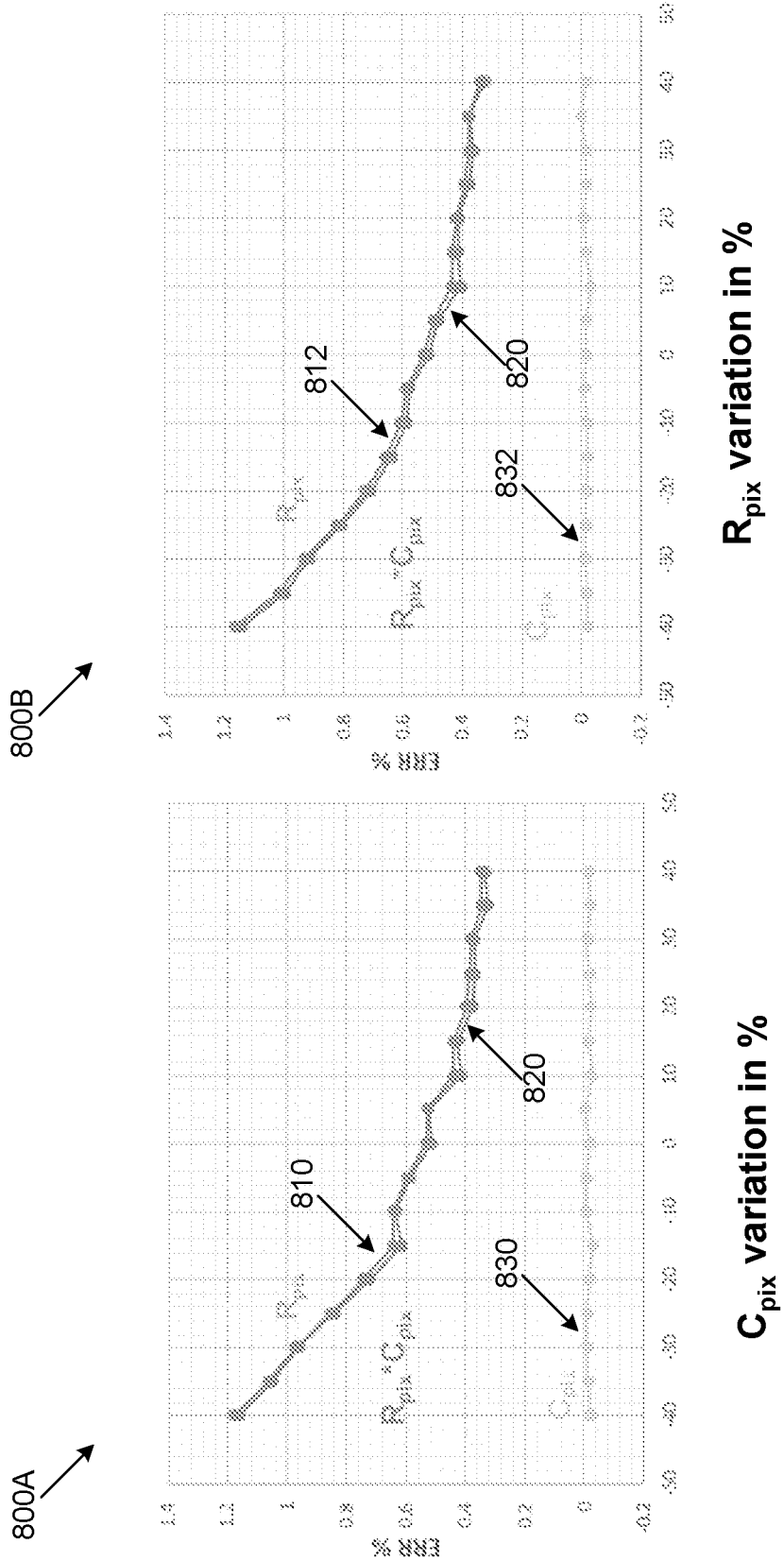
FIGS. 8A and 8B are charts illustrating simulation result with panel $C_p$ix and Rpix sweep, according to aspects of the subject technology.

FIGS. 8A and 8B are charts 800A and 800B illustrating simulation result with panel Rpix and Cpix sweep, according to aspects of the subject technology. The chart 800A includes plots 810, 820 and 830 showing errors (%) in values of Rpix, Cpix*Rpix and Cpix, respectively, versus Cpix variation (%). The chart 800B includes plots 812, 822 and 832 illustrating errors (%) in values of Rpix, Cpix*Rpix and Cpix, respectively, versus Rpix variation (%). The charts 700A and 700B indicate measurement error with a two-measurements method. The absolute measurement error on Cpix is improved from 8% (in 600A and 600B) to 0.1% (in 700A and 700B).

Figure 9:
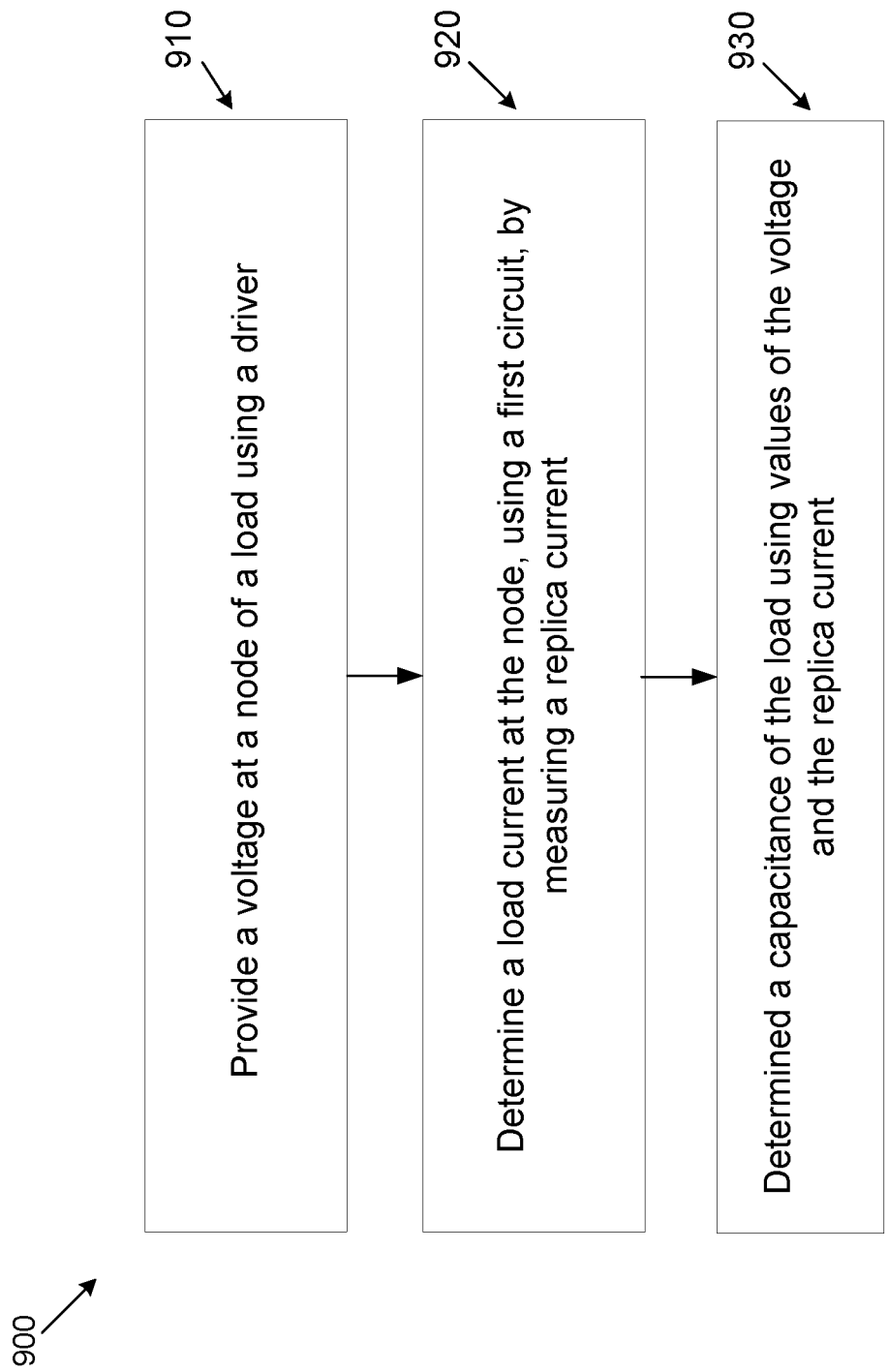
FIG. 9 is a flow diagram illustrating an example of a process for panel impedance sensing via a driver replica current, according to aspects of the subject technology.

FIG. 9 is a flow diagram illustrating an example of a process 900 for panel impedance sensing via a driver replica current, according to aspects of the subject technology. The process 900 includes providing a voltage at a node (e.g., node 232 of FIG. 2A) of a load (e.g., panel 250 of FIG. 2A) using a driver (e.g., driver circuit 202 of FIG. 2A) (block 910). The process 900 also includes determining a load current (e.g., pixel current Ipix of FIG. 2A) at the node by measuring a replica current (e.g., replica current Irep of FIG. 2A) using a first circuit (e.g., circuit 210 and the circuit 220 of FIG. 2A) (block 920). The process 900 further includes determining a capacitance (e.g., $C_{pix}$ of FIG. 5A) of the load using values of the voltage and the replica current (block 930)

Figure 10:
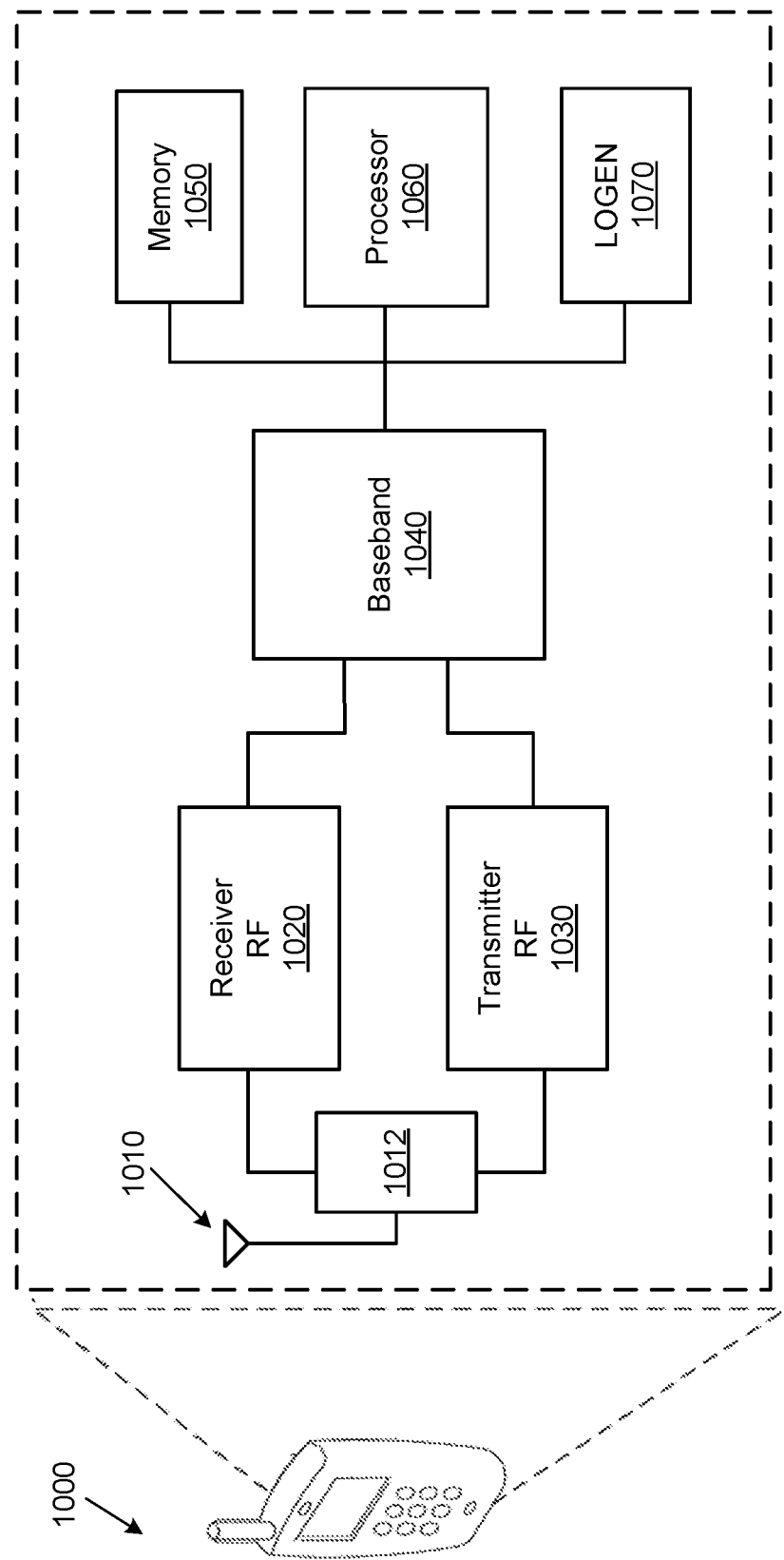
FIG. 10 illustrates an example of a wireless communication device, within which some aspects of the subject technology are implemented.

FIG. 10 illustrates an example of a wireless communication device 1000, within which some aspects of the subject technology are implemented. In one or more implementations, the wireless communication device 1000 can be a laptop computer, a desktop computer, a tablet, a smart TV, a smartphone, a smartwatch or other electronic devices, including one or more health-sense device(s). The wireless communication device 1000 may comprise an RF antenna 1010, a duplexer 1012, a receiver 1020, a transmitter 1030, a baseband processing module 1040, a memory 1050, a processor 1060 and a local oscillator generator (LOGEN) 1070. In various aspects of the subject technology, one or more of the blocks represented in FIG. 10 may be integrated on one or more semiconductor substrates. For example, blocks 1020-1070 may be realized in a single chip, a single system on a chip or in a multichip chipset.

The receiver 1020 may comprise suitable logic circuitry and/or code that may be operable to receive and process signals from the RF antenna 1010. The receiver 1020 may, for example, be operable to amplify and/or down convert received wireless signals. In various aspects of the subject technology, the receiver 1020 may be operable to cancel noise in received signals, and may be linear over a wide range of frequencies. In this manner, the receiver 1020 may be suitable for receiving signals in accordance with a variety of wireless standards, such as Wi-Fi, WiMAX, BT and various cellular standards. In various aspects of the subject technology, the receiver 1020 may not use any sawtooth acoustic wave filters, and a few or no off-chip discrete components such as large capacitors and inductors.

The transmitter 1030 may comprise suitable logic circuitry and/or code that may be operable to process and transmit signals from the RF antenna 1010. The transmitter 1030 may, for example, be operable to upconvert baseband signals to RF signals and amplify RF signals. In various aspects of the subject technology, the transmitter 1030 may be operable to upconvert and amplify baseband signals processed in accordance with a variety of wireless standards. Examples of such standards may include Wi-Fi, WiMAX, BT and various cellular standards. In various aspects of the subject technology, the transmitter 1030 may be operable to provide signals for further amplification by one or more power amplifiers.

The duplexer 1012 may provide isolation in the transmit band to avoid saturation of the receiver 1020 or damaging parts of the receiver 1020, and to relax one or more design requirements of the receiver 1020. Furthermore, the duplexer 1012 may attenuate the noise in the receiver band. The duplexer 1012 may be operable in multiple frequency bands of various wireless standards.

The baseband processing module 1040 may comprise suitable logic, circuitry, interfaces and/or code that may be operable to perform the processing of baseband signals. The baseband processing module 1040 may, for example, analyze received signals, generate control and/or feedback signals for configuring various components of the wireless communication device 1000, such as the receiver 1020. The baseband processing module 1040 may be operable to encode, decode, transcode, modulate, demodulate, encrypt, decrypt, scramble, descramble and/or otherwise process data in accordance with one or more wireless standards.

The processor 1060 may comprise suitable logic, circuitry and/or code that may enable processing data and/or controlling operations of the wireless communication device 1000. In this regard, the processor 1060 may be enabled to provide control signals to various other portions of the wireless communication device 1000. The processor 1060 may also control the transfer of data between various portions of the wireless communication device 1000. Additionally, the processor 1060 may enable implementation of an OS, or otherwise execute code to manage operations of the wireless communication device 1000. In one or more implementations, the processor 1060 may be interfaced with transducer modules via existing host interface technologies such as an inter-integrated circuit (I2C), a serial interface protocol (SPI), a peripheral component interconnect express (PCIE), a universal asynchronous receiver-transmitter (UART) and/or other interface technologies, depending on the data rate needed to sample and pipe from the transducers module to the processor 1060.

The memory 1050 may comprise suitable logic, circuitry and/or code that may enable storage of various types of information such as received data, generated data, code and/or configuration information. The memory 1050 may comprise, for example, RAM, ROM, flash and/or magnetic storage. In various aspects of the subject technology, information stored in the memory 1050 may be utilized for configuring the receiver 1020 and/or the baseband processing module 1040.

The LOGEN 1070 may comprise suitable logic, circuitry, interfaces and/or code that may be operable to generate one or more oscillating signals of one or more frequencies. The LOGEN 1070 may be operable to generate digital and/or analog signals. In this manner, the LOGEN 1070 may be operable to generate one or more clock signals and/or sinusoidal signals. Characteristics of the oscillating signals, such as the frequency and duty cycle, may be determined based on one or more control signals from, for example, the processor 1060 and/or the baseband processing module 1040.

In operation, the processor 1060 may configure the various components of the wireless communication device 1000 based on a wireless standard, according to which it is designed to receive signals. Wireless signals may be received via the RF antenna 1010, amplified, and down converted by the receiver 1020. The baseband processing module 1040 may perform noise estimation and/or noise cancellation, decoding and/or demodulation of the baseband signals. In this manner, information in the received signal may be recovered and utilized appropriately. For example, the information may be audio and/or video to be presented to a user of the wireless communication device 1000, data to be stored to the memory 1050 and/or information affecting and/or enabling operation of the wireless communication device 1000. The baseband processing module 1040 may modulate, encode and perform other processing on audio, video and/or control signals to be transmitted by the transmitter 1030 in accordance with various wireless standards.

In some implementations, the techniques of the subject technology can be utilized to measure panel impedance of a touch-display panel of the wireless communication device 1000 (not shown in FIG. 10 for simplicity) via a driver replica current (e.g., Irep of FIG. 2A), as discussed above.

The predicate words "configured to," "operable to" and "programmed to" do not imply any particular tangible or intangible modification of a subject, but rather are intended to be used interchangeably. For example, a processor configured to monitor and control an operation or a component may also mean the processor is being programmed to monitor and control the operation, or the processor being operable to monitor and control the operation. Likewise, a processor configured to execute code can be construed as a processor programmed or operable to execute code.

A phrase such as an "aspect" does not imply that such aspect is essential to the subject technology or that such aspect applies to all configurations of the subject technology. A disclosure relating to an aspect may apply to all configurations or one or more configurations. A phrase such as an "aspect" may refer to one or more aspects, and vice versa. A phrase such as a "configuration" does not imply that such configuration is essential to the subject technology or that such configuration applies to all configurations of the subject technology. A disclosure relating to a configuration may apply to all configurations or one or more configurations. A phrase such as a "configuration" may refer to one or more configurations, and vice versa.

The word "example" is used herein to mean "serving as an example or illustration." Any aspect or design described herein as an "example" is not necessarily to be construed as preferred or advantageous over other aspects or designs.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When a quantity is referred to herein as being "equal" or "proportional" to another quantity, it is to be understood that in engineering the quantities may not have absolutely accurate values due to a number of factors, which allow for reasonable deviations due to, for example, margins of error, tolerances, interferences, and other engineering realities.

All structural and functional equivalents to the elements of the various aspects described throughout this disclosure that are known, or later come to be known to those of ordinary skill in the art, are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have" or the like is used in the description or the claims, such term is intended to be inclusive in a manner similar to the term "comprise," as "comprise" is interpreted when employed as a transitional word in a claim.

Those of skill in the art would appreciate that the various illustrative blocks, modules, elements, components, methods and algorithms described herein may be implemented as electronic hardware, computer software or combinations of both. To illustrate this interchangeability of hardware and software, various illustrative blocks, modules, elements, components, methods and algorithms have been described above, generally in terms of their functionality. Whether such functionality is implemented as hardware or software depends upon the particular application, and design constraints imposed on the overall system. Skilled artisans may implement the described functionality in varying ways for each particular application. Various components and blocks may be arranged differently (e.g., arranged in a different order or partitioned in a different way), all without departing from the scope of the subject technology.

What is claimed is:

1. An apparatus, comprising:
    a driver circuit configured to provide a voltage at a node of a load, the voltage based on a first current;
    a first circuit configured to generate a second current proportional to the first current; and
    a second circuit configured to measure the first current by:
    measuring the second current; and
    determining a capacitance of the load using values of the voltage and the second current; and
    a current measurement circuit configured to provide a measurable voltage proportional to the second current, determine a resistance-capacitance (RC) model parameter associated with the load via measurements at different frequencies used to determine the capacitance.

2. The apparatus of claim 1, wherein:
    the load comprises at least a portion of a touch-display panel, and
    the first current comprises a pixel current provided to the touch-display panel.

3. The apparatus of claim 1, wherein the voltage comprises a voltage having a sinusoidal waveform.

4. The apparatus of claim 1, wherein the voltage comprises a peak-to-peak voltage.

5. The apparatus of claim 1, wherein:
    the second current comprises a first peak-to-peak value, and
    the first current comprises a load current comprising a second peak-to-peak value equal to the first peak-to-peak value.

6. The apparatus of claim 1, wherein the first circuit comprises a bias-current source configured to provide a component to the second current.

7. The apparatus of claim 1, further comprising a current measurement circuit configured to provide a measurable voltage proportional to the second current.

8. The apparatus of claim 1, wherein the current measurement circuit comprises a trans-impedance amplifier circuit configured to provide the measurable voltage.

9. The apparatus of claim 1, further comprising circuitry configured to remove an effect of a parasitic capacitance of the first circuit.

10. A circuit for impedance sensing, the circuit comprising:
a driver circuit configured to provide a voltage at a node, the voltage being based on a first circuit configured to generate a current, and
a second circuit coupled to the node, the second circuit configured to:
measure the current;
determining an admittance at the node by using the current and the voltage; and
a current measurement circuit configured to provide a measurable voltage proportional to the second current, determine a resistance-capacitance (RC) model parameter associated with the load via measurements at different frequencies used to determine the capacitance.

11. The circuit of claim 10, wherein the admittance comprises a capacitive admittance, and the node is part of a touch-display panel.

12. The circuit of claim 10, wherein the second circuit is configured to determine the admittance by using peak-to-peak values of the current and the voltage.

13. The circuit of claim 10, wherein the second circuit comprises a bias-current source configured to provide a component to the third current.

14. The circuit of claim 13, further comprising a trans-impedance amplifier circuit configured to provide a measurable voltage proportional to the current.

15. The circuit of claim 14, wherein:
the voltage comprises a stimulus voltage configured to electrically stimulate a third circuit coupled to the driver circuit at the node and operating at a frequency, and
the admittance is based on the frequency.

16. The circuit of claim 10, further comprising circuitry configured to remove a parasitic capacitance of the first circuit.

17. An apparatus, comprising:
a display panel;
a first circuit configured to provide a voltage at a node of the display panel, wherein the voltage is based on a first current; and
a second circuit coupled to the node and configured to:
receive a second current proportional to the first current;
determine a value of the second current;
determine a capacitance of the display panel by using peak-to-peak values of the voltage and the second current; and
a current measurement circuit configured to provide a measurable voltage proportional to the second current, determine a resistance-capacitance (RC) model parameter associated with the load via measurements at different frequencies used to determine the capacitance.

18. The apparatus of claim 17, further comprising a current-measurement circuit, wherein:
the second circuit comprises a bias-current source configured to provide a component to the second current to the current-measurement circuit,
the current-measurement circuit is configured to determine the value of the second current by providing a measurable voltage proportional to the second current.

19. The apparatus of claim 18, wherein the current-measurement circuit comprises a trans-impedance amplifier circuit configured to provide the measurable voltage.

* * * * *